United States Patent
Sato et al.

(10) Patent No.: US 6,404,672 B2
(45) Date of Patent: Jun. 11, 2002

(54) MAGNETIC ELEMENT AND MAGNETIC MEMORY DEVICE

(75) Inventors: Masashige Sato; Hideyuki Kikuchi; Kazuo Kobayashi, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/732,030

(22) Filed: Dec. 7, 2000

(30) Foreign Application Priority Data

Jan. 7, 2000 (JP) ..................................... 2000-001861

(51) Int. Cl.[7] .............................................. G11C 11/15
(52) U.S. Cl. ..................... 365/173; 365/171; 365/158
(58) Field of Search ................................. 365/173, 171, 365/158, 55, 50, 48, 66, 74, 232

(56) References Cited

U.S. PATENT DOCUMENTS 5,640,343 A * 6/1997 Gallagher et al. .......... 365/171
5,768,181 A * 6/1998 Zhe et al. ................... 365/158
5,946,227 A * 8/1999 Naji .......................... 365/158

FOREIGN PATENT DOCUMENTS

| JP | 408070149 A | * 3/1996 | .......... H01L/43/08 |
| JP | 09251621 A | 9/1997 | |
| JP | 11-168249 | 6/1999 | |
| JP | 11175925 A | 7/1999 | |

* cited by examiner

*Primary Examiner*—David Nelms
*Assistant Examiner*—David Lam
(74) *Attorney, Agent, or Firm*—Greer, Burns & Crain, Ltd.

(57) ABSTRACT

A magnetic element includes a first ferromagnetic layer, an insulating layer, and a second ferromagnetic layer laminated in this order. At least one of the first and second ferromagnetic layers includes a lower ferromagnetic layer, a nonmagnetic conductive layer, and an upper ferromagnetic layer laminated in this order. By changing the kind or the composition of material of the upper and lower ferromagnetic layers, the amount of magnetization of each layer can be controlled to reduce affection by magnetostatic coupling. Changeability of magnetized direction of the first or second ferromagnetic layer can be regulated thereby. This realizes an improvement of sensitivity.

12 Claims, 3 Drawing Sheets

MAGNETIC ELEMENT AND MAGNETIC MEMORY DEVICE

CROSS-REFERENCE TO RELATED APPLICATION

This application is based upon and claims priority of Japanese Patent Application No. 2000-001861, filed on Jan. 7, 2000, the contents being incorporated herein by reference.

BACKGROUND OF THE INVENTION

1. Field of the Invention

The present invention relates to magnetic elements using a ferromagnetic tunnel junction, and magnetic memory devices comprising such elements.

2. Description of the Related Art

An MRAM (Magnetic Random Access Memory) is one of a memory device such as a DRAM (Dynamic Random Access Memory) and an SRAM (Static Random Access Memory) using semiconductor substances. While the DRAM and the SRAM store data in accordance with the presence/absence of electric charges, the MRAM stores data in accordance with the magnetized directions of magnetic substances. MRAM has many merits, e.g., it is suitable for high speed operation, it shows high radiation resistance, and it shows little deterioration due to repetition of data write operations. For this reason, the study of the MRAM has been prosecuted earnestly in recent years.

The MRAM has its basic structure in which magnetic memory elements are arranged into a matrix, word and bit lines are disposed in columns and rows for generating a magnetic field in a selected element, and terminals are provided for reading out data stored in the selected element. When one of the word lines and one of the bit lines are selected, and electric currents are applied to the selected word and bit lines, a magnetic field is generated in the magnetic element at the intersection of the selected word and bit lines. The magnetized direction of the magnetic element can be reversed by the magnetic field. In this manner, two different magnetized states of each magnetic element can be realized. The two magnetized states correspond to bit data of "0" and "1", respectively.

For the memory structure of each magnetic element of an MRAM, usable are so-called MR (Magneto-Resistive) element, GMR (Giant Magneto-Resistive) element, and ferromagnetic tunnel element, any of which changes in its electric resistance in accordance with magnetized directions. To read out data from a magnetic element, an electric current is applied to the element and the electric resistance thereof is measured.

MRAM using an MR or a GMR element for the memory structure of each magnetic element has been realized. In this type of MRAM, however, the sheet resistance of each magnetic element is measured. Therefore, if the element size is reduced, the resistance to be measured is reduced accordingly, so that the output is reduced. Although reduction in size of such an element is a recent general demand, this type of MRAM has its limit.

A ferromagnetic tunnel element has a tunnel junction structure generally comprising a ferromagnetic layer, an insulating layer, and another ferromagnetic layer laminated in this order. In this structure, the tunnel resistance in cases when both the magnetic layers are magnetized in the same direction differs from those cases when magnetized in reverse directions. The amount of change in resistance depends on the polarizability of each magnetic layer. A change in resistance by more than 40–50% is expected if a suitable material is chosen. Besides, the smaller the junction area is, the higher the tunnel resistance is. Thus the element size can be reduced without reducing the output.

For these reasons, use of such a ferromagnetic tunnel junction structure for the memory structure of each magnetic memory element of an MRAM is expected to realize a higher packing density in the MRAM.

This idea for improving the packing density in an MRAM, however, includes the following vital problems.

First, each of the word and bit lines of an MRAM must receive an electric current for generating sufficient magnetic field that can reverse the magnetized direction of the target magnetic layer of each memory structure. For this reason, each of the word and bit lines requires a certain degree of size in its cross section. This requirement in size limits the packing density. To avoid this problem, the electric current for generating the magnetic field must be made small. This requires selection of a suitable magnetic material whose magnetized direction can be reversed with a weaker magnetic field.

Second, if the size of such a memory structure using ferromagnetic tunnel junction is reduced, both the ferromagnetic layers sandwiching the insulating layer may be magnetostatically coupled through leakage fluxes out of the ferromagnetic layers. This lowers the sensitivity of the memory element to an external magnetic field.

FIG. 1 shows such a magnetic memory structure. Referring to FIG. 1, ferromagnetic layers 101 and 103 sandwich an insulating layer 102. In this structure, the ferromagnetic layers 101 and 103 may be magnetically coupled with each other, so that leakage fluxes become very few. This causes a bad sensitivity to an external magnetic field.

FIG. 2 shows a more specific structure of a magnetic memory element in this type of MRAM. In this example, a ferromagnetic layer 101 (thickness: 2.0 nm) made of CoFe, an insulating layer 102 (thickness: 1.5 nm) made of $Al_2O_3$, and a ferromagnetic layer 103 (thickness: 1.0 nm) made of CoFe are laminated in this order on a magnetic underlayer 104 (thickness: 10 nm) made of IrMn. In this structure, external fluxes maybe made from an end of the CoFe layer 103 whose magnetized direction is fixed (hereinafter referred to as fixed layer), to an end of the CoFe layer 101 whose magnetized direction is to be reversed (hereinafter referred to as free layer). This causes very bad sensitivity of the CoFe layer 101 to an external magnetic field.

Besides, magnetic domain structure is a factor of stability of such a magnetic element. In general, a magnetic substance comprises a number of magnetic domains having the same magnetized direction. The boundary between such domains is called a magnetic domain wall. In case of a magnetic element of an MRAM in which a magnetized direction is changed, such magnetic domain walls may move. This causes noise and deterioration of sensitivity.

SUMMARY OF THE INVENTION

It is an object of the present invention to provide magnetic elements having a relatively simple construction, being less affected by magnetostatic coupling, and capable of realizing improvement of the sensitivity for reversing magnetized direction by a single domain structure. It is another object of the present invention to provide magnetic memory devices comprising such magnetic elements for realizing less power consumption, high-speed operation, and high packing density.

According to an aspect of the present invention, a magnetic element comprises a first ferromagnetic layer, an insulating layer, and a second ferromagnetic layer laminated in this order. At least one of the first and second ferromagnetic layers comprises a lower ferromagnetic layer, a non-magnetic conductive layer, and an upper ferromagnetic layer laminated in this order.

Preferably, the upper and lower ferromagnetic layers sandwiching the non-magnetic conductive layer are antiferromagnetically coupled with each other.

Preferably, the magnetized direction of at least one of the first and second ferromagnetic layers is fixed by an adjacent antiferromagnetic layer.

Preferably, the non-magnetic conductive layer is made of one of Ru and Cu.

Preferably, the amount of magnetization of the upper ferromagnetic layer differs from that of the lower ferromagnetic layer.

Preferably, the thickness of the upper ferromagnetic layer differs from that of the lower ferromagnetic layer.

According to another aspect of the present invention, a magnetic memory device comprises magnetic elements each of which comprises a first ferromagnetic layer, an insulating layer, and a second ferromagnetic layer laminated in this order. The magnetized direction of one of the first and second ferromagnetic layers is changeable in accordance with data to be stored. At least one of the first and second ferromagnetic layers comprises a lower ferromagnetic layer, a non-magnetic conductive layer, and an upper ferromagnetic layer laminated in this order.

According to the present invention, at least one of the first and second ferromagnetic layers has the structure that upper and lower ferromagnetic layers sandwich a non-magnetic conductive layer. By properly selecting the kind or composition of the material and the thickness of each of the upper and lower ferromagnetic layers, the amount of magnetization of each of them can be so regulated as to reduce the affection by magnetostatic coupling. Changeability of magnetized direction of the first or second ferromagnetic layer in response to external magnetic field can thereby be adjusted into a suitable value. This affords an improvement of sensitivity.

According to the present invention, realized are magnetic elements having a relatively simple construction, being less affected by magnetostatic coupling, and capable of improving the sensitivity for reversing magnetized direction by a single domain structure. Also realized are magnetic memory devices comprising such magnetic elements for less power consumption, high-speed operation, and high packing density.

DETAILED DESCRIPTION OF THE PREFERRED EMBODIMENTS

Hereinafter, embodiments of the present invention will be described with reference to drawings.

FIRST EMBODIMENT

Figure 1:
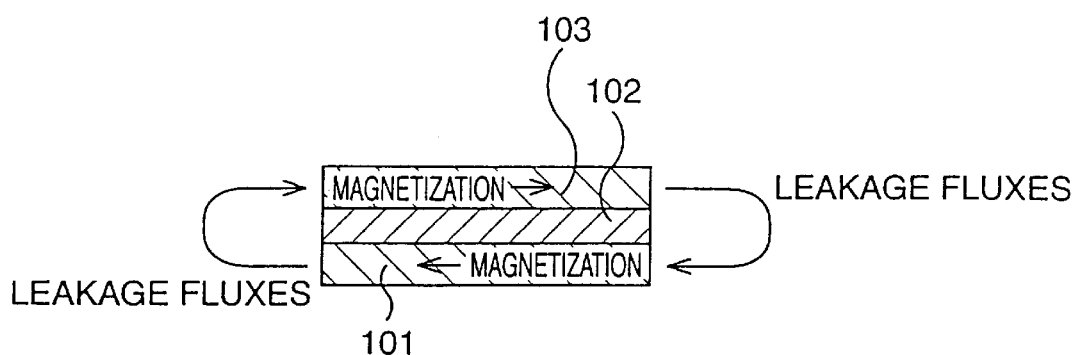
FIG. 1 is a schematic sectional view of a conventional ferromagnetic tunnel junction structure comprising a ferromagnetic layer, an insulating layer, and another ferromagnetic layer laminated in this order, for explaining a problem of the conventional structure.
Figure 2:
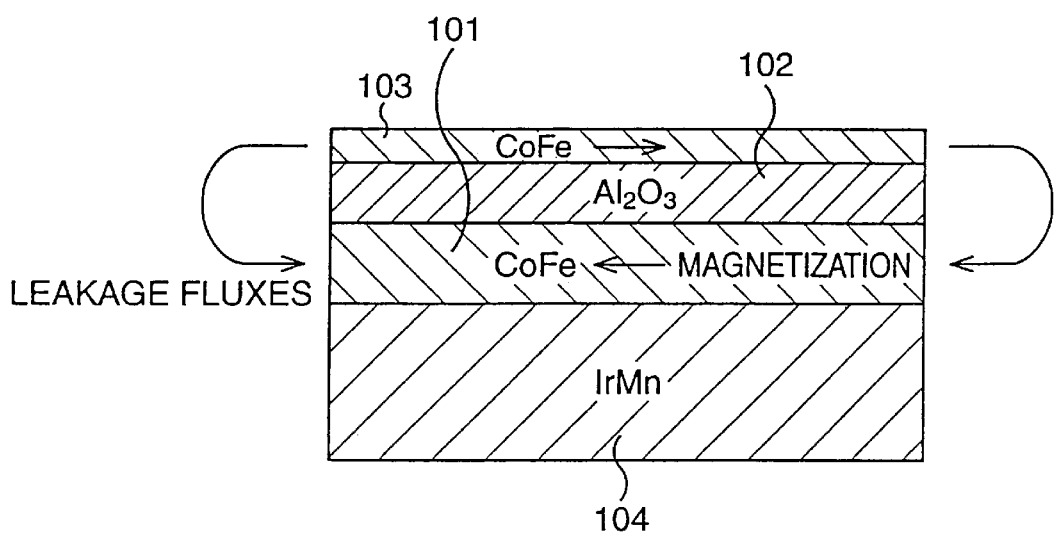
FIG. 2 is a schematic sectional view showing a specific structure of a conventional magnetic memory element of MRAM.
Figure 3:
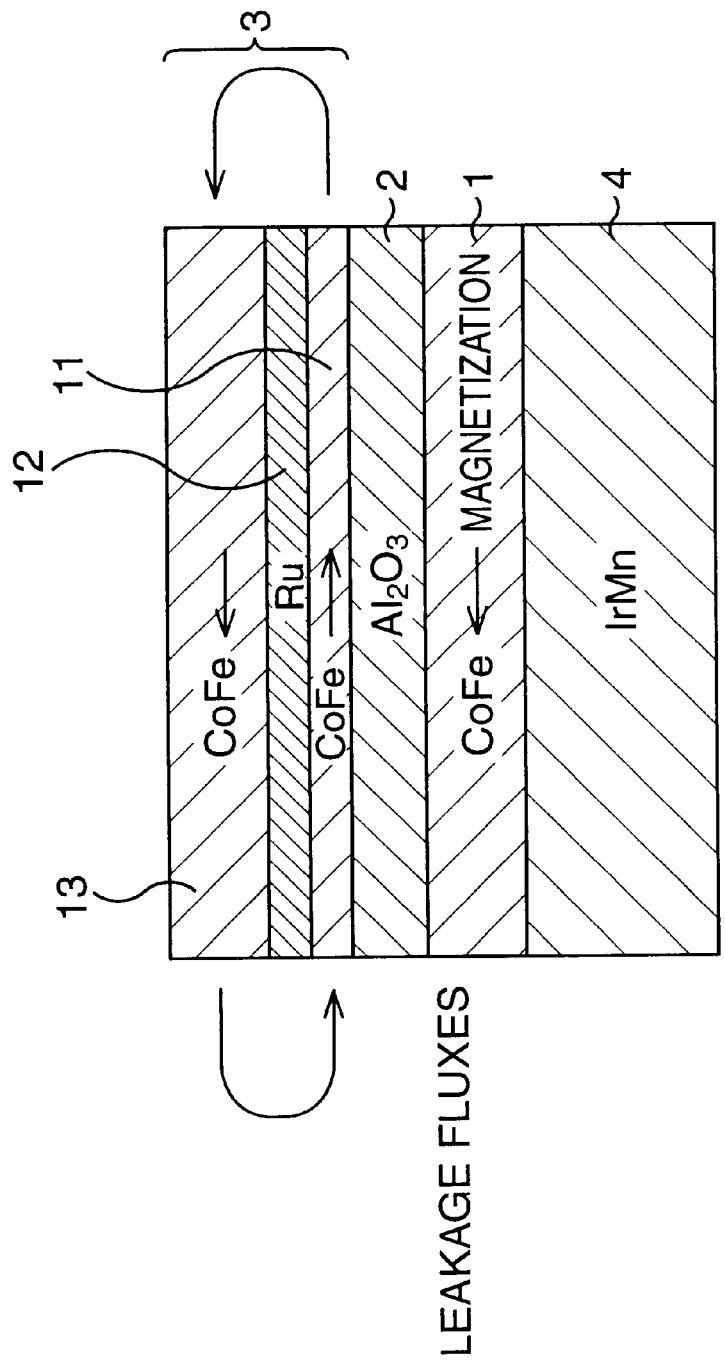
FIG. 3 is a schematic sectional view showing a specific structure of a magnetic element according to the present invention.

The first embodiment of the present invention will be described. In this first embodiment, a magnetic element will be described. FIG. 3 is a schematic sectional view showing a specific structure of a magnetic element according to this embodiment.

The magnetic element comprises a ferromagnetic layer 1 as fixed layer, an insulating layer 2, and a ferromagnetic layer 3 as free layer, which are formed in this order on a magnetic underlayer 4. The ferromagnetic layers 1 and 3 and the insulating layer 2 function as a ferromagnetic tunnel junction. In this embodiment, the ferromagnetic layer 3 is made up from the lower ferromagnetic layer 11, a non-magnetic conductive layer 12, and the upper ferromagnetic layer 13 laminated in this order. More specifically, the magnetic underlayer 4 is made of IrMn to have a thickness of about 10 nm. The ferromagnetic layer 1 is made of CoFe to have a thickness of about 2.0 nm. The insulating layer 2 is made of $Al_2O_3$ to have a thickness of about 1.5 nm. The lower ferromagnetic layer 11 is made of CoFe to have a thickness of about 1.0 nm. The non-magnetic conductive layer 12 is made of Ru to have a thickness of about 0.8 nm. The upper ferromagnetic layer 13 is made of CoFe to have a thickness of about 2.0 nm. Any of these layers can be formed by sputtering process. The non-magnetic conductive layer 12 may be made of Cu in place of Ru.

Generally in such a structure of ferromagnetic layer/non-magnetic conductive layer/ferromagnetic layer, it is known that the upper and lower ferromagnetic layers are magnetically coupled if the thickness of the non-magnetic conductive layer is regulated properly. In case of the non-magnetic conductive layer of Ru, the ferromagnetic layers are antiferromagnetically coupled when the thickness of the non-magnetic conductive layer is about 0.8 nm.

If the upper and lower ferromagnetic layers 13 and 11 sandwiching the nonmagnetic conductive layer 12 have the same thickness, the magnetization of both the ferromagnetic layers cancels out. As a result, leakage fluxes become very few and the sensitivity becomes bad. If a little difference in thickness is made between the ferromagnetic layers, there appears the magnetization corresponding to the difference in thickness. The magnetized direction of this apparent magnetization can be changed with an external magnetic field. The amount of the apparent magnetization is determined by the amount of the magnetization and the thickness of each ferromagnetic layer. Thus the amount of the apparent magnetization can be finely controlled by changing the thickness, or kind or composition of material of the ferromagnetic layers.

According to this embodiment, in the ferromagnetic layer 3 as free layer, the lower ferromagnetic layer 11 is magnetically coupled with the upper ferromagnetic layer 13 disposed on the non-magnetic conductive layer 12. The lower ferromagnetic layer 11 is, therefore, not magnetically coupled with the ferromagnetic layer 1 as fixed layer. Besides, since the upper and lower ferromagnetic layers 13 and 11 sandwiching the non-magnetic conductive layer 12 differ in the amount of magnetization, there appears an apparent magnetization whose magnetized direction can be changed with an external magnetic field. Further, since the upper and lower ferromagnetic layers 13 and 11 are antiferromagnetically coupled to be in a stable state, there is formed a single domain. Therefore, the element is somewhat protected from being affected by noise or instability due to movement of the magnetic domain walls. This makes it possible to suppress the affection by the magnetostatic coupling of the ferromagnetic layers 1 and 3, and to maintain the sensitivity to an external magnetic field.

In this embodiment, the ferromagnetic layer 3 is made into the structure of ferromagnetic layer/non-magnetic conductive layer/ferromagnetic layer. But, the ferromagnetic layer 1 may be made into such a three-layer structure in place of the ferromagnetic layer 3. Further, both the ferromagnetic layers 1 and 3 may be made into three-layer structures. In this manner, fine control of the amount of magnetization in accordance with conditions becomes possible.

The second embodiment of the present invention will be described next. In this second embodiment, a magnetic memory device (MRAM) comprising such magnetic elements as described in the first embodiment will be described.

Figure 4:
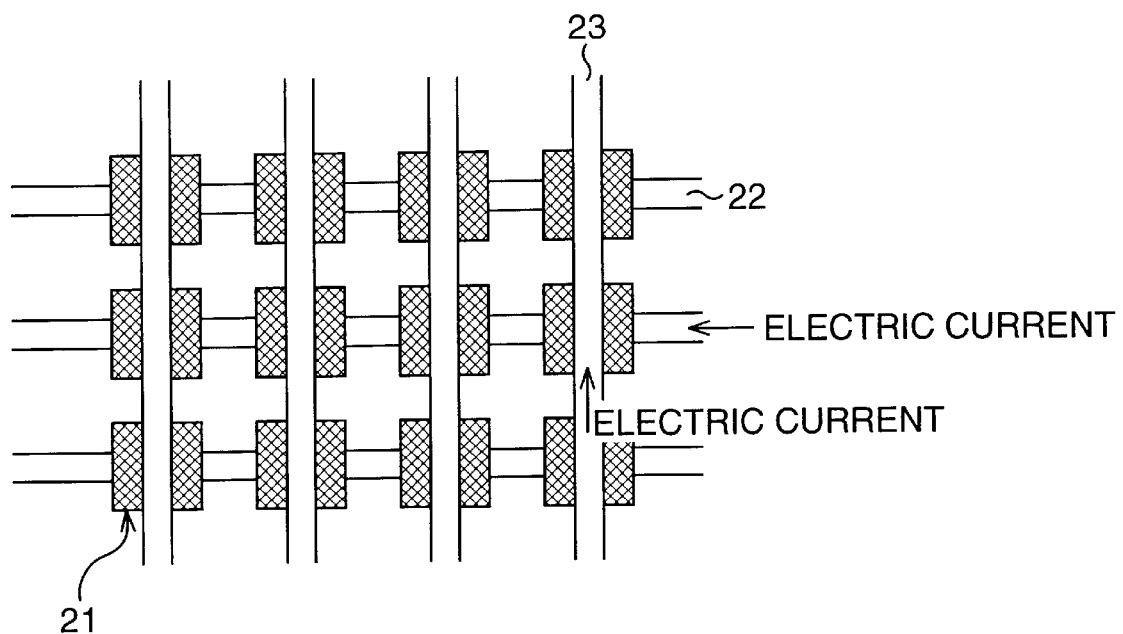
FIG. 4 is a schematic plan view of a principal part of MRAM according to the present invention.

FIG. 4 is a schematic plan view of a principal part of MRAM according to this embodiment.

In MRAM, magnetic elements 21 are arranged into a matrix. The magnetic elements 21 in each column are connected through a word line 23, and the magnetic elements 21 in each row are connected through a bit line 22. Terminals (not shown) are provided for reading out data from any target magnetic element. When one of the word lines 23 and one of the bit lines 22 are selected, and electric currents are applied to the selected word and bit lines, magnetic field is generated in the magnetic element 21 at the intersection of the selected word and bit lines. The magnetized direction of the magnetic element 21 is reversed by the magnetic field. In this manner, the magnetic element 21 is set at one of two different magnetized states. Bit data of "0" or "1" is thereby stored in the magnetic element 21.

In this embodiment, since such magnetic elements as shown in FIG. 3 are used for MRAM, sure data write and read can be performed even if each element is reduced in size. This makes it possible to realize highly reliable MRAM with less power consumption, high-speed operation, and high packing desity In this embodiment, the magnetic element described in the first embodiment is applied to an MRAM. In the present invention, however, the magnetic element of the first embodiment is not limited to such an application. The magnetic element of the first embodiment can sufficiently be applied also to various magnetic sensors including magnetic heads for example.

A magnetic element according to the present invention can be used not only for an MRAM but also for a magnetic sensor, e.g., as a sensor device for a magnetic disk. That is, the present invention can apply to either of a magnetic memory device and a magnetic storage device. Here, "magnetic storage device" means, e.g., a data storage device in which data write and read operations in relation to a very small bit area on a magnetic storage medium rotating at a high speed, such as a magnetic disk, are performed through a head that a magnetic sensor is incorporated in and that is mechanically driven to be put close to the storage surface of the medium, while "magnetic memory device" means an electronic device in which data write and read operations are performed entirely in an electronic manner. The magnetic memory device has its basic structure in which a memory cell as a data storage unit is provided at each intersection of bit and word lines, like usual DRAM. In the magnetic memory device, however, usual memory cells as capacitor cells are replaced by magnetic elements, so that data write and read operations in relation to each memory cell are performed electromagnetically. Such a magnetic memory device is currently called an MRAM (Magnetic Random Access Memory) or the like and thus it is premised on random access. But, even in case of a device called an MRAM, it has fundamentally no need for data refresh operations at short intervals. In spite of the present situation, a magnetic memory device according to the present invention can be used as a read-only memory in which only read operations for data stored in a semipermanent form are possible. Besides, it can also be used like a flash memory in which data stored therein is electrically erasable only in a lump. Thus the present invention is not limited to such devices as dynamic random access memories in which data refresh operations are performed at regular intervals.

Although the invention has been described in its preferred form with a certain degree of particularity, it is understood that various further changes, modifications, and alternations can be made in the invention without departing from the spirit and the scope thereof.

What is claimed is:

1. A magnetic element comprising:
   a first ferromagnetic layer;
   an insulating layer; and
   a second ferromagnetic layer laminated in this order;
   wherein at least one of said first and second ferromagnetic layers includes a lower ferromagnetic layer, a non-magnetic conductive layer, and an upper ferromagnetic layer laminated in this order; and
   wherein said upper and lower ferromagnetic layers sandwiching said non-magnetic conductive layer are antiferromagnetically coupled with each other.

2. A magnetic element according to claim 1, wherein the magnetized direction of at least one of said first and second ferromagnetic layers is fixed by an adjacent antiferromagnetic layer.

3. A magnetic element according to claim 2, wherein the magnetized direction of at least one of said first and second ferromagnetic layers is fixed an adjacent antiferromagnetic layer.

4. A magnetic element according to claim 1, wherein said non-magnetic conductive layer is made of one of Ru and Cu.

5. A magnetic element according to claim 1, wherein the amount of magnetization of said upper ferromagnetic layer differs from that of said lower ferromagnetic layer.

6. A magnetic memory device comprising:
   magnetic elements each of which include a first ferromagnetic layer, an insulating layer, and a second ferromagnetic layer laminated in this order,
   wherein the magnetized direction of one of said first and second ferromagnetic layers is changeable in accordance with data to be stored, and
   at least one of said first and second ferromagnetic layers includes a lower ferromagnetic layer, a non-magnetic conductive layer, and an upper ferromagnetic layer laminated in this order; and
   wherein said upper and lower ferromagnetic layers sandwiching said non-magnetic conductive layer are antiferromagnetically coupled with each other to form an antiferromagnetic layer.

7. A magnetic memory device according to claim 6, wherein the magnetized direction of at least one of said first and second ferromagnetic layers is fixed by an adjacent antiferromagnetic layer.

8. A magnetic memory device according to claim 6, wherein said non-magnetic conductive layer is made of one of Ru and Cu.

9. A magnetic memory device according to claim 6, wherein the amount of magnetization of said upper ferromagnetic layer differs from that of said lower ferromagnetic layer.

10. A magnetic memory device according to claim 6, wherein the thickness of said upper ferromagnetic layer differs from that of said lower ferromagnetic layer.

11. A magnetic memory device according to claim 6, wherein each of said magnetic elements forms a memory cell, with one of said first and second ferromagnetic layers being connected to a word line while the other being connected to a bit line.

12. A magnetic memory device according to claim 6, wherein each of said magnetic elements forms a memory cell interposed between a word line and a bit line at the intersection of said word and bit lines, with one of said first and second ferromagnetic layers being connected to said word line while the other being connected to said bit line.

* * * * *

UNITED STATES PATENT AND TRADEMARK OFFICE
CERTIFICATE OF CORRECTION

PATENT NO. : 6,404,672 B2
DATED : June 11, 2002
INVENTOR(S) : Sato et al.

It is certified that error appears in the above-identified patent and that said Letters Patent is hereby corrected as shown below:

<u>Column 6,</u>
Lines 33-36, delete "A magnetic element according to claim 2, wherein the magnetized direction of at least one of said first and second ferromagnetic layers is fixed an adjacent antiferromagnetic layer." and insert -- A magnetic element according to claim 1, wherein the thickness of said upper ferromagnetic layer differs from that of said lower ferromagnetic layer. --

Signed and Sealed this

Thirtieth Day of March, 2004

JON W. DUDAS
*Acting Director of the United States Patent and Trademark Office*